United States Patent [19]

Wilcox

[11] Patent Number: 5,982,207

[45] Date of Patent: Nov. 9, 1999

[54] INTEGRATED CIRCUIT OUTPUT BUFFER WITH REDUCED VOLTAGE OUTPUT SWING

[75] Inventor: David J Wilcox, Faringdon, United Kingdom

[73] Assignee: Mitel Semiconductor Limited, United Kingdom

[21] Appl. No.: 08/755,985

[22] Filed: Nov. 25, 1996

[30] Foreign Application Priority Data

Dec. 6, 1995 [GB] United Kingdom ............ 9524957

[51] Int. Cl.$^6$ .................................. H03K 17/687
[52] U.S. Cl. .................. 327/112; 327/170; 327/437; 327/391; 327/333
[58] Field of Search ................ 327/108, 112, 327/333, 170, 380, 434, 437, 482, 391

[56] References Cited

U.S. PATENT DOCUMENTS

| | | | |
|---|---|---|---|
| 4,573,177 | 2/1986 | Petrosky | 377/60 |
| 4,791,326 | 12/1988 | Vajdic et al. | 327/391 |
| 5,089,723 | 2/1992 | Davis et al. | |
| 5,105,102 | 4/1992 | Shioda. | |
| 5,144,169 | 9/1992 | Hirabayashi et al. | 327/490 |
| 5,210,506 | 5/1993 | Koch et al. | 330/255 |
| 5,351,012 | 9/1994 | Toumazou | 330/264 |
| 5,517,148 | 5/1996 | Yin | 327/333 |
| 5,559,476 | 9/1996 | Zhang et al. | 331/57 |
| 5,754,078 | 5/1998 | Tamagawa | 330/255 |

FOREIGN PATENT DOCUMENTS 0 509 113 A1  10/1991  European Pat. Off. .

OTHER PUBLICATIONS

Patent Abstracts of Japan, vol. 012, No. 268, Jul. 27, 1988 and JP 63 050209 A, Matsushita Electric Ind. Co., Ltd., Mar. 3, 1988, Abstract.

Goto, e tal., "*A current conveyor II realized by mosfets and its application to swtiched capacitor filters*", Electronics and Communications in Japan, vol. 69, No. 1, 1986, pp. 10–17.

*Primary Examiner*—Terry D. Cunningham
*Attorney, Agent, or Firm*—Kirschstein, et al.

[57] ABSTRACT

An output buffer of an integrated circuit arranged to be energised from a supply source providing predetermined potentials to supply conductors of the integrated circuit, comprises a potential divider $R_1$, $R_2$, $R_3$ to define reference levels $V_1$, $V_2$ having a reduced swing compared to the supply levels $V_{DD}$ and 0, which reference levels are transferred to an output node $V_{out}$, so that the reference potentials are unaffected by the loading of the output node, which the reduced voltage swing reduces pick-up caused by switching of the output buffer.

6 Claims, 1 Drawing Sheet

INTEGRATED CIRCUIT OUTPUT BUFFER WITH REDUCED VOLTAGE OUTPUT SWING

BACKGROUND OF THE INVENTION

This invention relates to output buffers for integrated circuits.

The invention is especially concerned with output controls of the integrated circuit having a large logic swing which operate circuits which only require a small logic swing. For example, in a CMOS (complementary metal oxide semiconductor) integrated circuit within a frequency synthesizer, the logic swing is 5 volts, whereas the modulus input of a pre-scaler within a phase locked loop forming the synthesizer only requires a logic swing of between 0.7 and 0.8 volts, since the latter is formed from bipolar semiconductors. A major problem is that other adjacent devices can pick up unwanted signals from these outputs.

SUMMARY OF THE INVENTION

It is therefore desirable to provide an output buffer having a reduced voltage swing.

The invention provides an output buffer of an integrated circuit arranged to be energized from a supply source providing predetermined potentials to supply conductors of said integrated circuit, the buffer comprising a potential divider, arranged to be supplied by the predetermined potentials and to define first and second reference potentials at first and second nodes, respectively, intermediate the predetermined potentials and thus defining a reduced voltage swing, a first pair of field effect semiconductor devices, the control electrodes of which are coupled together, and an electrode of one device being connected to the first node and the corresponding electrode of the other device of the pair being connected to an output node, a second pair of field effect semiconductor devices, the control electrodes of which are coupled together, and an electrode of one device being connected to the second node and the corresponding electrode of the other device of the pair also being connected to the output node, the dimensions of the channel of each semiconductor device that is connected to the output node being related to the dimensions of the channel of the other device of the respective pair, and the first and second pair being alternately energizable to permit the transfer of either the first or second reference potential to the output node.

BRIEF DESCRIPTION OF THE DRAWING

An output buffer of an integrated circuit constructed in accordance with the invention will now be described, by way of example, with reference to the accompanying drawings, in which.

DETAILED DESCRIPTION OF THE PREFERRED EMBODIMENTS

Figure 1:
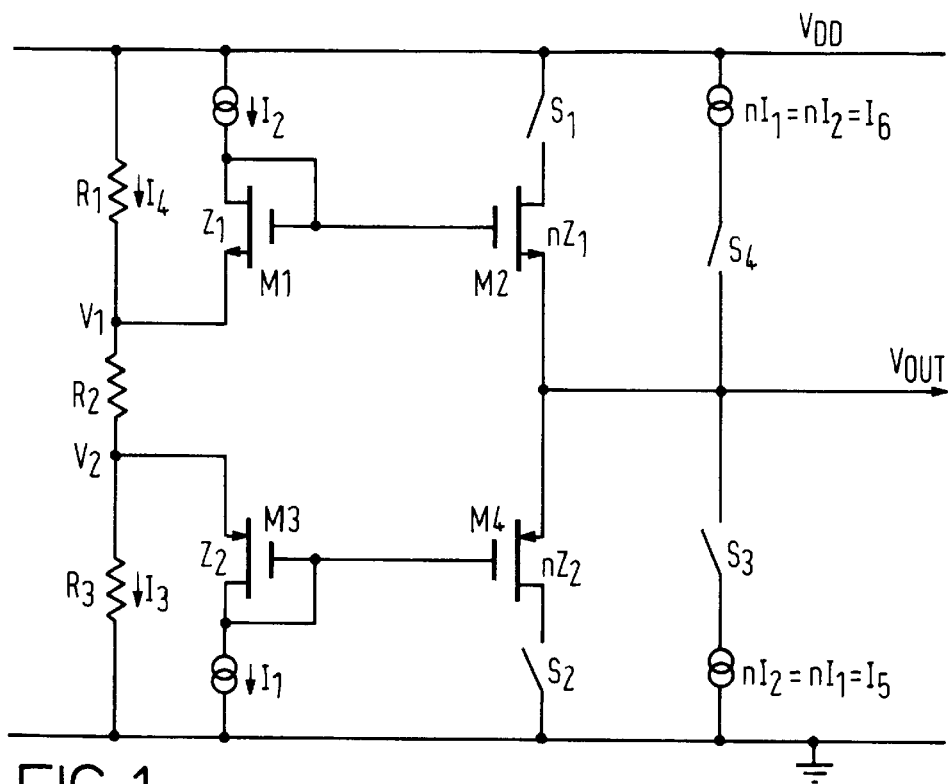
FIG. 1 is a circuit showing a first form of output buffer.

Referring to FIG. 1, the buffer forms part of a CMOS integrated circuit within a frequency synthesizer (not shown) used in the r.f circuit of a mobile telephone. The frequency synthesizer includes a phase lock loop which includes a pre-scaler which uses bipolar transistors and which varies the divide-by ratio in the phase lock loop. The divide-by ratio (or modulus) of the pre-scaler is varied between two fixed values by a modulus control output on the CMOS integrated circuit.

The reference levels for the CMOS i.c. are a five volt logic swing and the modulus control output buffer provides a reduced logic swing of between 0.6 volts peak to peak and 1.1 volts peak to peak.

Referring to FIG. 1, a potential divider comprises resistors $R_1$, $R_2$, $R_3$ which is connected between rails $V_{DD}$ of 5 volts and 0 volts, the CMOS voltage reference levels. The potential divider defines, in conjunction with a pair of first current sources $I_1$, $I_2$, first and second reference potentials V, V, at first and second nodes, respectively, which potentials are intermediate the potentials $V_{DD}$ and 0.

Assuming that $I_1 = I_2$, and $I_3 = I_4$.

$$V_{DD} = (R_1 + R_3)I_3 + (I_1 + I_3)R_2$$

$$V_1 = V_{DD} - R_1 I_3$$

$$V_2 = R_3 - R_1 I_3$$

$$V_1 - V_2 = (I_1 + I_3)R_2.$$

If $R_1 = R_3$, the signal swing will be symmetrical around mid-supply. However the output node $V_{out}$ is required to rapidly charge and discharge capacitance associated with the modulus control input of the pre-scaler, (namely, the output capacitance of the buffer, the input capacitance of the pre-scaler plus stray capacitance such as board wiring) and the potential divider lacks the current capacity to do this. For this reason, the reference potentials $V_1$ and $V_2$ are transferred to the output node $V_{out}$ by, respectively, a first pair of FETs M1, M2 of nmos conductivity type and a second pair of FETs M3, M4 of pmos conductivity type. The FETs M1, M3 are connected as diodes since the gates are connected to the respective drains, and are biased on, above the threshold voltage $V_t$ by respective current generators $I_2$, $I_1$. The gates of each pair of FETs are connected together, and it is envisaged that the gate source voltage $V_{gs}$ of the FETs of each pair are the same, to enable voltages $V_1$, $V_2$ to be alternately transferred to node $V_{out}$.

The current through a FET is given by $$I_{DS} = K(V_{gs} - V_t)^2,$$

where $V_{gs}$ is the voltage between the gate and source of the FET and $V_t$ is the threshold voltage. K is a constant which depends on the aspect ratio of the channel, W/L, i.e. the ratio of the width to the length of the channel of the FET. $V_{gs}$ is dependent on $I_{DS}$ and W/L and, in order that $V_{gs}$ is the same for M2, as for M1, the physical dimensions of FET M2 are such that the aspect ratio W/L of the channel is n times larger than the $W/L = Z_1$ of M1, and a current generator $nI_2$ is provided for biasing the FET M2 above its threshold voltage $V_t$ which is n times larger than the bias current $I_2$ through M1. The same applies to M3 and M4.

Thus, when $V_{out}$ is at the potential $V_2$ (switches $S_2$ and $S_4$ closed), and $S_1$ and $S_3$ are simultaneously closed, while switches $S_2$ and $S_4$ simultaneously open, $V_{gs}$ for M2 becomes greater than $V_{gs}$ for M1. Hence, a large current flows through M2 and the difference between this current and $nI_2$ flows through $V_{out}$ to the modulus control output. The capacitance associated with that node is rapidly charged, so that $V_{gs}$ reduces and the current through M2 reduces. When the capacitance is fully charged to $V_1$, $V_{gs}$ of M2 is equal to that for M1 and the current through M2 is equal to $nI_2$.

Switches $S_1$, $S_3$ open and $S_2$, $S_4$ close to switch the node $V_{out}$ to $V_2$, and the operation is the same.

Typically $I_1 = I_2 = I_3 = I_4 = 20$ μA, whereas the peak current available at $V_{out}$ is typically approximately 50 mA. The circuit was designed to operate at 15 MHz with an input to output delay of 8 ns.

The switchable current sources on the output node are required to accurately define the output voltage, to prevent the output devices entering the sub-threshold region and to define the output impedance. The circuit may also be operated without the switchable current sources but with reduced performance resulting specially in a much higher output impedance. As another alternative, the aspect ratio of M2 could be the same as that of M1, and n could equal unity for the current generator $nI_2$ (and the same for M4, M3 and $nI_1$). While the current available for switching would be much smaller, the potential of the output node would be unaffected by its loading.

Figure 2:
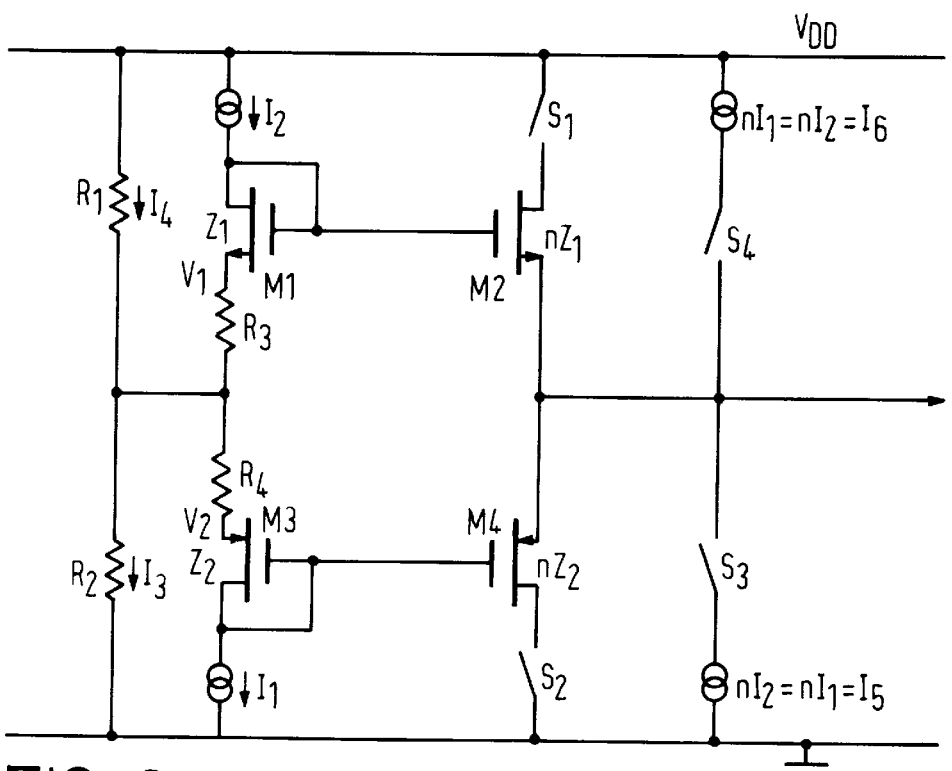
FIG. 2 is a circuit showing a second form of output buffer.

An alternative means of generating reference voltages $V_1$ and $V_2$ is shown in FIG. 2. Resistors $R_1$ and $R_2$ define a mid-supply reference voltage ($R_1=R_2$). Resistors $R_3$ and $R_4$ together with current sources $I_1$ and $I_2$ define the upper and lower levels for the output voltage swing.

If $$I_1=I_2, I_3=I_4, \text{ and } R_1=R_2, \text{ and } R_3=R_4$$

then $$V_1=V_{DD}-I_3R_1+I_1R_3$$

and $$V_2=I_3R_1-I_1R_3$$

and therefore because $$I_3R_1=V_{DD}/2$$

we have $$V_1=V_{DD}/2+I_1R_3$$

and $$V_2=V_{DD}/2-I_1R_3.$$

Hence $$V_1-V_2=2I_1R_3.$$

The output swing is symmetrical around mid-supply. $V_1$ and $V_2$ are transferred to the output in the same way as that described above for the circuit of FIG. 1, and the modifications described for FIG. 1 are also applicable.

The accuracy of the generated output voltages will depend on the matching accuracy of resistors $R_1$, $R_2$ and $R_3$, $R_4$ together with the matching accuracy of current sources $I_1$, $I_2$ together with the absolute tolerance on $R_3$, $R_4$ and $I_1$, $I_2$.

When implementing the circuits of FIG. 1 and FIG. 2, there may be provided two output stages in the sense that M2, M4, $nI_1$, $nI_2$ may be duplicated in order to provide a second output node $V_{out}'$ at which antiphase voltages to that appearing at $V_{out}$ are present, i.e. a differential output buffer. Alternatively, the outputs $V_{out}$ and $V_{out}'$ may be completely independent, i.e. a dual output buffer. The current sources $I_1$, $I_2$, $nI_1$, $nI_2$ may all be slaved to a master reference current generator formed by a FET and a resistor to the power supply. As an alternative $I_1$, $I_2$, $nI_1$, $nI_2$ may be produced from a stable reference voltage such as a band gap reference voltage which is forced across a resistor $R_{ref}$ to generate a current $I_{ref}$, $I_1$, $I_2$, $nI_1$ and $nI_2$ are then proportional to $I_{ref}$.

All resistors are fabricated using the same resistor material so that the output voltage swing $V_1-V_2$ is independent of sheet resistivity. Devices M1 to M4 are minimum length and wide enough to ensure that gate drive VE ($=V_{gs}-V_t$) is small and that sufficient drive is available to the output load. To ensure adequate matching between $I_1$ and $I_2$ current sources $I_1$ and $I_2$ (also $nI_1$, $nI_2$) are implemented with long channel length devices to reduce output conductance. Decoupling capacitors may be employed between the gates of M1 and M3 and the respective supply rails in order to reduce voltage transients due to charge coupling between the outputs and a relatively high impedance bias circuit. This coupling can result in erroneous output voltages if it is not attenuated. The worst case for charge coupling occurs when the inputs, and hence outputs, are in-phase. A much reduced net coupling occurs when the inputs/outputs are in antiphase due to a first order cancellation of coupled charges. Decoupling capacitors may also be used on the gates of FETs used as current sources $nI_1$ and $nI_2$ and connected to the supply rails, for the same reason. The output voltage swing for FIG. 1 and FIG. 2 may be centred on $V_{DD}/2$ (mid-supply), but for some applications, the center of the swing could be offset towards either of the supplies $V_{DD}$ or 0 volts by appropriate choice of current and resistor values.

Means may be provided where the output buffer may become tristate when a standby input becomes active so that all current sources are turned off.

I claim:

1. An output buffer of an integrated circuit energized from a supply source for supplying a predetermined supply potential and a ground potential to conductors of the integrated circuit, the buffer comprising:

a) a potential divider, arranged to be supplied by the supply potential and the ground potential, and operative for defining first and second reference potentials at first and second nodes, respectively, the first and second reference potentials being intermediate the supply and ground potentials to thereby define a reduced voltage swing;

b) a first pair of field effect semiconductor devices having control electrodes coupled together, an electrode of one device of the first pair being connected to the first node, a corresponding electrode of the other device of the first pair being connected to an output node, another electrode of the one device of the first pair being connected to the supply potential by a first current source, and a corresponding another electrode of the other device of the first pair being connected to the supply potential by a first switch;

c) a second pair of field effect semiconductor devices having control electrodes coupled together, an electrode of one device of the second pair being connected to the second node, a corresponding electrode of the other device of the second pair also being connected to the output node, another electrode of the one device of the second pair being connected to ground potential by a second current source, and a corresponding another electrode of the other device of the second pair being connected to ground potential by a second switch;

d) each other device of the first and second pairs that is connected to the output node having a channel with dimensions that are related to dimensions of a channel of the one devices of the first and second pairs; and e) the first and second pairs being alternately energizable to transfer one of the first and second reference potentials to the output node.

2. The output buffer as claimed in claim 1, in which the channel of each of the other devices that is connected to the output node has an aspect ratio which is proportional to, but not less than, an aspect ratio of the channel of the one devices of the first and second pairs.

3. The output buffer as claimed in claim 2, in which the aspect ratio of the channel of each of the other devices of the first and second pairs is proportional to, and greater than, the dimensions of the channel of the respective one device of the first and second pairs.

4. The output buffer as claimed in claim 2; and further comprising a third current source connected between the supply potential and the output node and switchable to provide a path for biasing current through the other device of the second pair when the other device of the second pair is energized, and a fourth current source connected between the ground potential and the output node and switchable to provide a path for biasing current through the other device of the first pair when the other device of the first pair is energized.

5. The output buffer as claimed in claim 4, in which the one devices each have a conductive path between their respective another electrode and control electrode, the first current source is related to the fourth current source in the same relative proportion as the aspect ratios of the channels of the one and the other devices of the first pair, and the second current source is related to the third current source in the same relative proportion as the aspect ratios of the channels of the one and the other devices of the second pair.

6. The output buffer as claimed in claim 1, in which the semiconductor devices of one of the pairs are of an opposite conductivity type to the semiconductor devices of the other of the pairs.

* * * * *